United States Patent
Varadarajan et al.

(10) Patent No.: US 8,192,806 B1
(45) Date of Patent: Jun. 5, 2012

(54) PLASMA PARTICLE EXTRACTION PROCESS FOR PECVD

(75) Inventors: Sesha Varadarajan, Lake Oswego, OR (US); Edward Augustyniak, Tualatin, OR (US); Jeffrey Benzing, Saratoga, CA (US)

(73) Assignee: Novellus Systems, Inc., San Jose, CA (US)

( * ) Notice: Subject to any disclaimer, the term of this patent is extended or adjusted under 35 U.S.C. 154(b) by 1111 days.

(21) Appl. No.: 12/070,616

(22) Filed: Feb. 19, 2008

(51) Int. Cl.
H05H 1/24 (2006.01)
(52) U.S. Cl. .......................... 427/569; 427/570
(58) Field of Classification Search .................. 427/569, 427/577, 570
See application file for complete search history.

(56) References Cited

U.S. PATENT DOCUMENTS

| | | | | |
|---|---|---|---|---|
| 5,252,178 A | * | 10/1993 | Moslehi | 134/1.1 |
| 6,036,878 A | * | 3/2000 | Collins | 216/68 |
| 6,499,425 B1 | * | 12/2002 | Sandhu et al. | 118/723 E |
| 6,893,532 B1 | | 5/2005 | Sato et al. | |
| 7,594,479 B2 | * | 9/2009 | Yonezawa et al. | 118/723 E |
| 2001/0006093 A1 | * | 7/2001 | Tabuchi et al. | 156/345 |
| 2004/0201023 A1 | * | 10/2004 | Yamazaki et al. | 257/75 |
| 2005/0241762 A1 | * | 11/2005 | Paterson et al. | 156/345.28 |
| 2006/0211224 A1 | * | 9/2006 | Matsuda | 438/493 |
| 2007/0020941 A1 | * | 1/2007 | Tamura et al. | 438/710 |

FOREIGN PATENT DOCUMENTS

JP 8-260156 * 10/1996

OTHER PUBLICATIONS

Ali, Alanazi, et al., "Roughness and deposition mechanism of DLC films prepared by r.f. plasma glow discharge". Vacuum, vol. 51, No. 3, pp. 363-368, 1998.*
Yabe, Y, et al., "Synthesis of well-aligned carbon nanotubes by radio frequency plasma enhanced CVD method". Diamond and Related Materials 13 (2004) 1292-1295.*
Praburam et al., Observations of Particle Layers in a Radio-Frequency Sputtering Plasma, J.Vac. Sci. Technol. A 12(6) Nov./Dec. 1994, pp. 1-9.
Interconnect, International Technology Roadmap for Semiconductors: 2006 Update, no page numbers.
Long et al. "Examining upcoming yield enhancement challenges in the 2001 roadmap", ITRS Update, www.micromagazine.com/archive/02/02/long.html, no page numbers.
Los Alamos National Laboratory, Dateline Los Alamos, September Issue 1996, pp. 1-20.
Okuyama, et al. Development of next generation clean plasma processing, Research Center for Nondevices and Systems, Hiroshima University, no page #s.

* cited by examiner

Primary Examiner — Bret Chen
(74) Attorney, Agent, or Firm — Weaver Austin Villeneuve & Sampson LLP

(57) ABSTRACT

A plasma-enhanced chemical vapor deposition (PECVD) process including plasma particle extraction is described. Charged particles suspended in discharge volume are moved together with a plasma and can then be flushed away. The particle extraction process reduces unwanted particles on the wafer after deposition and reduces total process time. In some embodiments, the process can involve powering an electrode in the process chamber located away from the wafer. This electrode can be powered up as the main deposition electrode is powered down.

12 Claims, 8 Drawing Sheets

PLASMA PARTICLE EXTRACTION PROCESS FOR PECVD

FIELD OF THE INVENTION

The invention relates to semiconductor processing, particularly to apparatus and methods to deposit conductive and dielectric layers. More specifically, the invention relates to an apparatus and method to control a plasma in a plasma-enhanced chemical vapor deposition (PECVD) process.

BACKGROUND

Plasma-enhanced chemical vapor deposition (PECVD) processes utilize plasma energy to deposit thin films of material on a wafer. Plasma is any gas in which a significant percentage of the atoms or molecules are ionized. The plasma may be generated by different methods, for example, with a direct-current discharge, a capacitive discharge, or an inductive discharge. A capacitive discharge is a frequently used method to generate plasma and is created by RF frequency between two parallel electrodes, usually in the shape of disks. The RF may be generated at a high frequency, usually at a standard 13.56 MHz, and optionally at a low frequency, usually about 100-400 kHz.

Reactive gases, also known as precursors, are fed into the plasma. The plasma energy causes the reactive gases to decompose and form a film on the wafer surface. The use of plasma allows films to be deposited at a lower temperature than non-plasma enhanced CVD. Thus, PECVD is mainly used for the deposition of dielectric films like silicon oxide or nitride layers at low temperatures. It can be also used to deposit silicon carbide, poly-silicon or carbon layers.

PECVD processes yield good adhesion and high growth rates. By varying process parameters, film properties may be fine-tuned. Adjustable film properties include adhesion, compressive and tensile stress, hydrogen content, density, etch selectivity, step coverage, stoichiometry, and cleanliness. As interconnect size decreases, PECVD process performance and deposited film property requirements increase. Thus, improved methods and apparatus for PECVD are needed.

SUMMARY OF THE INVENTION

The present invention provides apparatuses and methods to reduce particle-induced defects on a wafer. During plasma-enhanced chemical vapor deposition (PECVD), particles may be generated and accumulate in the plasma. These particles become trapped in certain regions of the plasma, typically near the outer boundary of the plasma, sometimes referred to as the plasma sheath, by electric forces and may fall onto the wafer when the plasma is extinguished. At the end of a plasma-enhanced chemical vapor deposition process, a plasma particle extractor expands and moves a plasma away from the wafer surface and extracts the suspended particles in the plasma. The particle extractor is a separately controlled electrode in the process chamber located away from the wafer. Generally, the particle extractor powers up as the main deposition electrode powers down to trap particles at its plasma sheath located away from the wafer. The particles are then flushed away. The particle extraction process reduces unwanted particles on the wafer after deposition and reduces total process time.

In one aspect, the present invention pertains to a method of PECVD. A wafer is provided in a process chamber that includes three electrodes and a wafer support. A first RF power is provided to a first electrode. One or more precursors are provided to the plasma. The plasma decomposes the precursors into ions and radicals, which react to form a reaction product. The reaction product deposits onto the wafer. Particles generated in the gas phase during the deposition are suspended in the plasma, typically at the plasma sheath. Particles are "trapped" in plasma, that is, they stay in the plasma volume for significant time due to forces acting upon them at the plasma sheath. Many of the traps are localized near wafer edge. Toward the end of the deposition, a second RF power is provided to the third electrode. As the second RF power increases, the plasma expands to envelop the area surrounding the third electrode and thereby move particles trapped in the plasma to the new plasma boundary. The first RF power to the first electrode is reduced, further shaping the plasma. When the power to the first electrode is turned off, the particles are trapped in a plasma around the third electrode and away from the wafer. The second RF power to the third electrode is reduced. The particles are then flushed away from the chamber.

In certain embodiments, the RF power to the third electrode increases while the RF power to the first electrode decreases. The RF power to the third electrode may increase over a specific time period so as not to agitate particles suspended in plasma. In certain embodiments, the RF powers to the first and third electrode are synchronized and in phase. Phase lock-in of RF powers minimizes voltage between the first and third electrode, and thus minimizes undesired discharge between them while sustaining discharges to the return electrode, that is, the second electrode.

In another aspect, the present invention pertains to a method of reducing plasma-induced contamination on wafers. The method includes generating a plasma in a reaction chamber, depositing material onto the wafer while holding a plasma-induced particle in a plasma sheath, expanding the plasma beyond the space above the wafer, trapping the particle at a location beyond the space above the wafer, and flushing the particle from the chamber. The method may also include extinguishing the plasma.

In yet another aspect, the present invention pertains to a semiconductor processing apparatus. The apparatus includes a wafer support, a showerhead, a first electrode, a second electrode, a third electrode, and a pumping port. The first electrode is electrically connected to a first RF generator. The second electrode is a return electrode. The third electrode is electrically connected to a second RF generator. In some instances, the first and second RF generator may be the same. In this case, a switch is used to direct part of the RF power to the third electrode or disconnect RF power from it. The switch may be mechanical or solid state and it may switch RF power abruptly (on/off) or gradually (ramping).

The first, second, and third electrodes may include multiple pieces. Usually, the first and second electrodes are a showerhead and the wafer support. The showerhead may be the first or second electrode, and vice versa. The second electrode may also include parts of the chamber wall.

The third electrode is located away from the wafer. The third electrode may be called the particle extractor electrode or simply the extractor electrode. In order to extract particles so that they do not fall onto the wafer after deposition, the third electrode may be located outside of a cylindrical space formed by a showerhead and the wafer support, both of which are in the shape of circular disks. The third electrode may circumferentially surround the cylindrical space, in whole or in part. If in part, the location about the perimeter of the pieces of third electrode may correspond to the locations of various pumping ports, so that trapped particles may exit the chamber quickly when the plasma is extinguished. The third electrode may be located at a same elevation as the showerhead, in between the showerhead and the wafer support, or at the wafer support level. The third electrode may include one or more pieces that are electrically connected to each other. In some embodiments, the third electrode or the wafer support may move to further isolate the wafer from the particles in the plasma. The wafer support may move down and away from the plasma at the end of deposition, and the third electrode may move up or down to shift the plasma boundary.

The invention may also be more generally applicable in other semiconductor processing contexts. For example, the concept of using a third electrode to move trapped particles may be applicable to other plasma generators.

These and other features and advantages of the present invention will be described in more detail below with reference to the associated drawings.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION OF A PREFERRED EMBODIMENT

Introduction

Figure 1A:
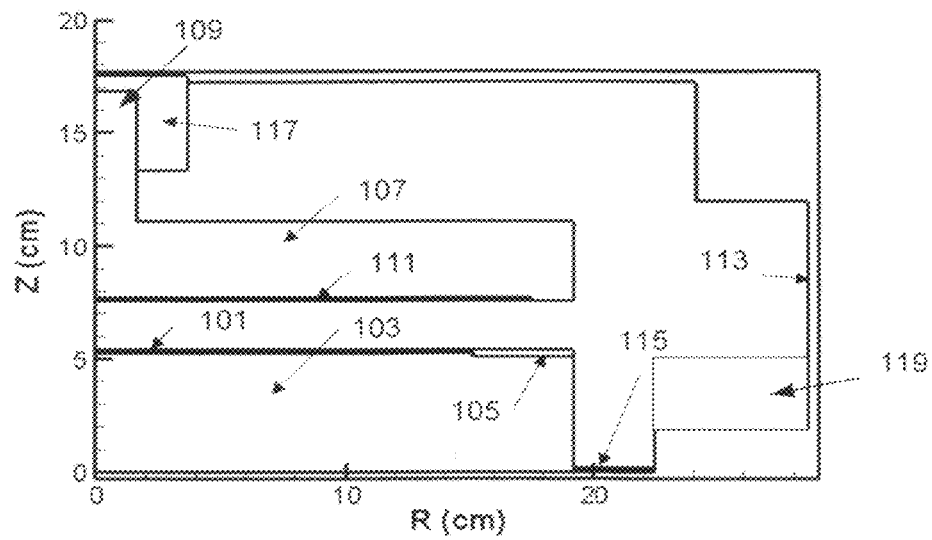
FIGS. 1A and 1B are graphic depictions of a PECVD chamber particle model.

Embodiments of the present invention are described herein in the context of a plasma-enhanced chemical vapor deposition (PECVD) chamber and process. Those skilled in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

The term "semiconductor device" as used herein refers to any device formed on a semiconductor substrate or any device possessing a semiconductor material. In many cases, a semiconductor device participates in electronic logic or memory, or in energy conversion. The term "semiconductor device" subsumes partially fabricated devices (such as partially fabricated integrated circuits) as well as completed devices available for sale or installed in particular apparatus. In short, a semiconductor device may exist at any state of manufacture that employs a method of this invention or possesses a structure of this invention. The terms "wafer" and "substrate" refers to the work pieces on which processing may be performed and may be used interchangeably in this disclosure.

As noted above, the present invention provides a method of reducing plasma-induced contamination on wafers. Defect reduction is an ever-present goal in semiconductor processing. As interconnect size shrinks, the critical defect size and the particles-per-wafer-pass (PPWP) defect target also shrink. As an example for generic metal etch, the PPWP target was about 1000 in the year 2000 and projected to be about 100 in the year 2010. For CVD insulator applications, the defect target was 0.0711 per $cm^2$ in 2001, but for 2007, the defect target is 0.023 per $cm^2$. The critical defect size is also smaller, from about 65 nm in 2001 to 32.5 nm for 2007 and even to 20 nm by 2011. Non-critical particles becomes critical as the size of interconnect size reduce. Previously unimportant small particle generators are now identified and become target of reduction. The dramatic change the defect target forces all sources of contamination to be examined and reduced, no matter how much they contribute. The 2001 information is obtained from Long, et al., ITRS Update: Examining upcoming yield enhancement challenges in the 2001 roadmap, MICRO Magazine, February, 2002 (archived at http://www-.micromagazine.com/archive/02/02/long.html). The 2007 information is obtained from ITRS: 2006 Update, International Technology Roadmap for Semiconductors, Table 82a on page 13.

One such particle generator is the plasma used in semiconductor processing. Plasma is used, for example, in PECVD as a source of energy to decompose chemical precursors. Plasma is typically generated by applying radio frequency (RF) energy at a high frequency to an electrode, typically a showerhead in a chamber through which chemical precursors flow (top electrode). A second electrode is typically a plasma return electrode, on which sits the wafer to be deposited (bottom electrode). Other configurations exist that apply RF power to the bottom electrode or to the both electrodes. One or more RF sources are used to deliver energy to the process area. The present invention is applicable to all these configurations, although this disclosure focuses on the capacitive type plasma where the RF power is applied to the showerhead.

There are several sources of particles that show up in the process plasma. Under some circumstances plasma may knock-off material from the showerhead surface. It is also possible that the gas may carry particles as contamination. Finally, particles are created in the plasma with gas phase nucleation. Plasma-generated particles typically range in size from a few nanometers to about hundreds of nanometers.

Particles suspended in plasma grow by accumulating material. Both number of particles and their average size increase during the deposition cycle. While in plasma, particles are subjected to a combination of forces: ion drag, neutral drag, electric, gravity, and thermophoresis. The ion drag is caused by the ions moving in the bulk plasma toward the plasma boundaries. As the ions move, they collide with these particles and push them toward the plasma boundary. Similarly, the neutral drag is caused by neutral species (not electrically charged) moving in the bulk plasma. Neutral species may be inert gases and un-ionized precursors. These neutral species tend to move toward the wafer and then out horizontally toward the wafer edge, causing the particles to also move toward the direction of the vacuum pumping ports through which the neutral species exhaust. Gravity pulls the particles downward, but because the particles are very small, gravity may be the weakest force acting on these particles. With thermophoresis, particles tend to move to a region of lower temperature, for example, the showerhead. Electric forces appear to be the strongest force acting on these particles at plasma sheaths. Electric forces are weak in the bulk plasma but they become much stronger in plasma sheaths. Particles become negatively charged in plasma and are confined to the plasma side of the plasma sheath boundary because electric field in the sheath repels them.

In one calculation for a 100 nm particle, the gravitational force ($\sim 10^{-17}$N) was found two orders of magnitude below that of thermophoresis ($\sim 10^{-15}$N), which is one order of magnitude below that of neutral drag ($\sim 10^{-14}$N). The electric force, on the other hand, may be two orders of magnitude larger than neutral drag ($\sim 10^{-12}$N). For a larger 500 nm particle, the numbers are different but the electric force remains the strongest one.

These forces tend to move the particles in different directions. The electric force tends to levitate the particles at the plasma sheath. The neutral drag tends to move particles horizontally toward the edge of the wafer. Forces that tend to move the particles downwards toward the wafer are gravity, ion drag, and neutral drag. The particles move until they reach a place where the forces are balanced or are moved beyond the showerhead and wafer support area.

A model of particle movements in a plasma showed that particles tend to accumulate in certain areas. FIG. 1A is a graphic depiction of the modeled chamber. A wafer 101 is shown on top of wafer support 103. A carrier ring 105 whose top surface is flush with the wafer surrounds the wafer 101. The carrier ring 105 transfers wafers between stations of a multi-station process chamber and is usually made of a ceramic material. Vertically opposing the wafer support is a showerhead 107. Showerhead 107 is attached to the top of the chamber by a stem 109 through which the precursors flow to the perforated showerhead face plate 111. A ceramic collar 117 surrounds the top of the stem 109. The grounded chamber wall is shown as 113. Pumping ports 115 are located below and around the wafer support 103. An indexer 119 lifts the carrier ring 105 to transfer wafer 101 from station to station. The connection between the indexer 119 and the carrier ring 105 is not shown in FIG. 1A, but they are typically connected in three places around the circumference of the carrier ring.

Figure 1B:
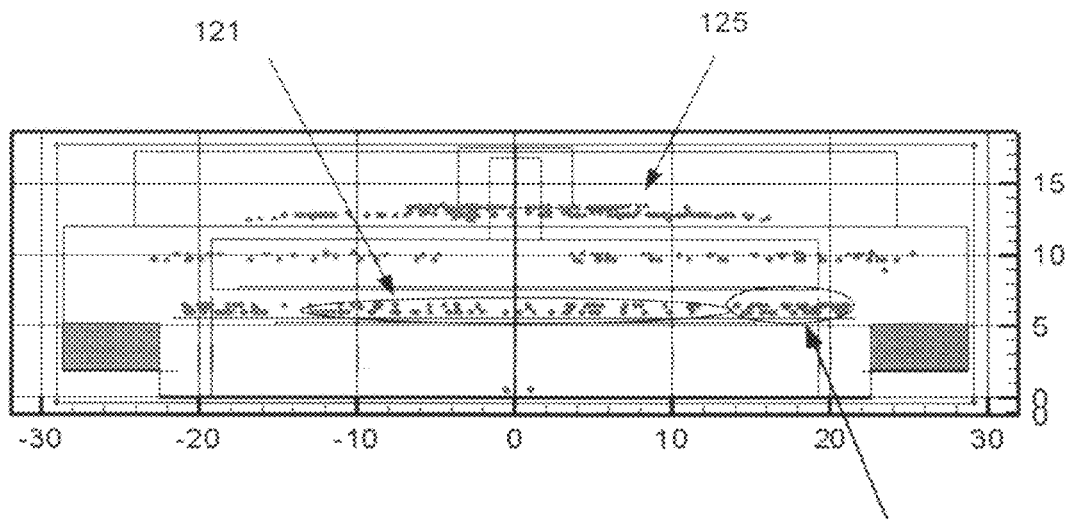

The modeling result is shown in FIG. 1B. Particles are found to accumulate in several areas. Region 121 represents a space above the wafer. Particles are trapped in this region by a strong electric force. Particles in region 121 remain suspended in the plasma during deposition, but when the plasma is extinguished, or collapses, the electric force that suspends the particles disappears. Particles in region 121 are then subjected only to the ever-present forces of neutral drag, gravity, and thermophoresis. These particles may land on the wafer and cause a defect in the fabricated device.

Region 123 is a space above the carrier ring. Negatively charged dust particles may accumulate in this region because of a plasma density non-uniformities between the showerhead and wafer support at this region. Negatively charged dust particles are trapped in this region by electrical repulsion. As shown in FIG. 1B, significant amounts of particles are present above the showerhead in region 125. Model result shows that significant plasma density is present in this region.

Particles trapped in these regions may have sizes in order of several nanometers to several hundred nanometers. As discussed above, preventing some or all of these particles landing on the wafer became more important as feature sizes reduce.

To reduce these particles landing on the wafer, techniques of finishing a deposition cycle evolved into a complicated series of steps. First the reactive gas is turned off to reduce or eliminate gas-phase nucleation, so no more particles are created. Then the inert gas flow is increased, to increase the neutral drag for the particles to move horizontally off the space above the wafer. At the same time or after, RF power is ramped down so that the plasma does not collapse suddenly and agitate the particles. Usually, a time period of a few seconds passes between the time reactive gas precursors is turned off and plasma extinguishes to allow the suspended particles to be flushed away. As indicated above, however, the neutral drag force is fairly weak, two orders of magnitude weaker than the electric force suspending the particles at the sheath, so that some time lapses before the plasma may be extinguished. During this time, very little deposition takes place because the reactive gas is turned off.

The present invention expands plasma beyond the wafer and allows particles moving outward rather than staying above the wafer. Particles are released from electric traps formed around the wafer edge and can be removed from the space above the wafer in shorter amount of time. Throughput increases because the overall processing time decreases as stations resume deposition processes without the longer wait for the suspended particles to be removed from the chamber.

Process

Figure 2A:
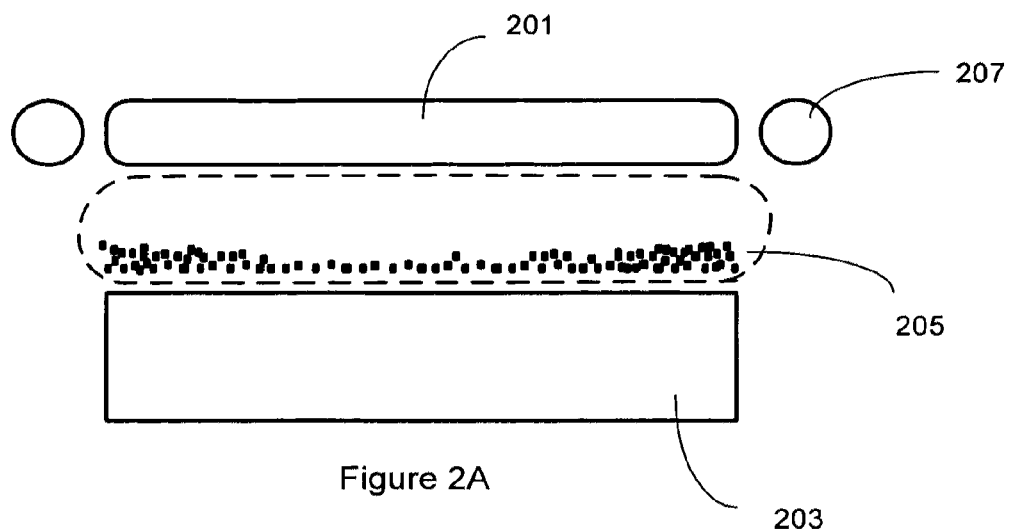
FIGS. 2A-2D are cross sectional schematics depicting various stages of a method in accordance with an embodiment of the present invention.
Figure 2B:
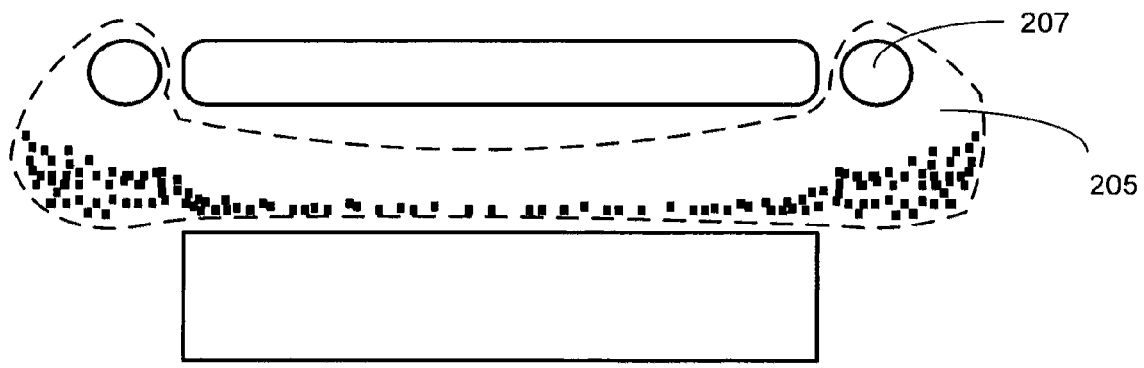
Figure 2C:
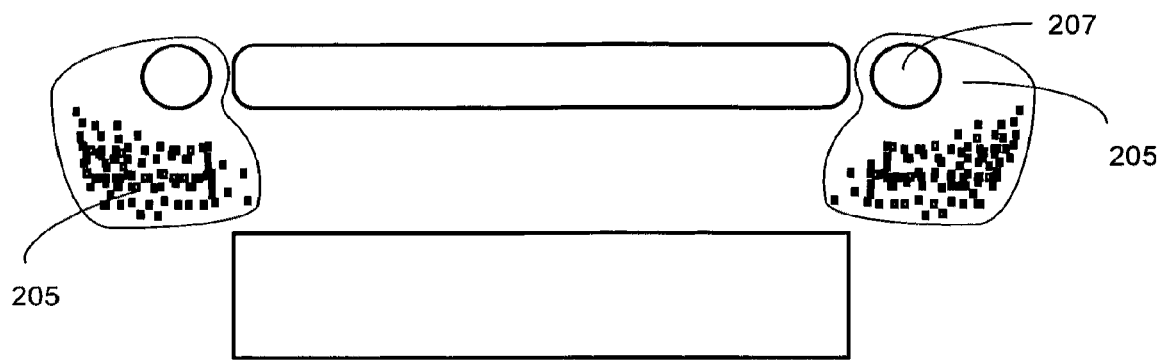
Figure 2D:
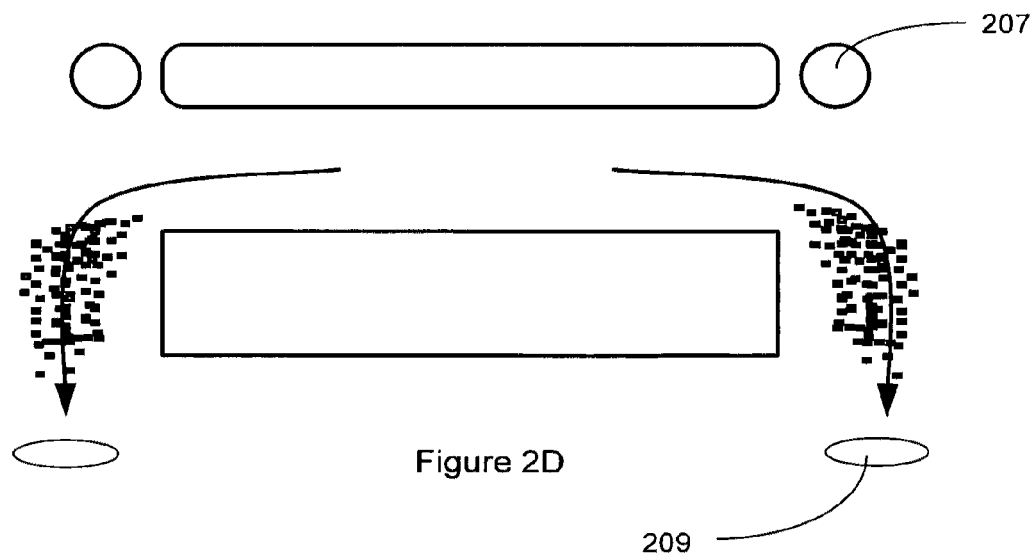

FIGS. 2A to 2D shows cross-sectional schematic of an implementation of the present invention. The stages are deposition (FIG. 2A), extraction (FIG. 2B), trapping (FIGS. 2C), and flushing (FIG. 2D). In FIG. 2A, negatively charged particles are suspended in plasma 205 at the sheath boundary above the wafer support 203 and below the showerhead 201. A third electrode 207 in the shape of a ring around the showerhead is not powered. The deposition stage according to this implementation of the present invention is not different from other PECVD processes. In fact, the present invention is not limited to a particular material deposited or particular process parameters. The present invention is applicable to any plasma assisted deposition process where the plasma induces particles.

Figure 3:
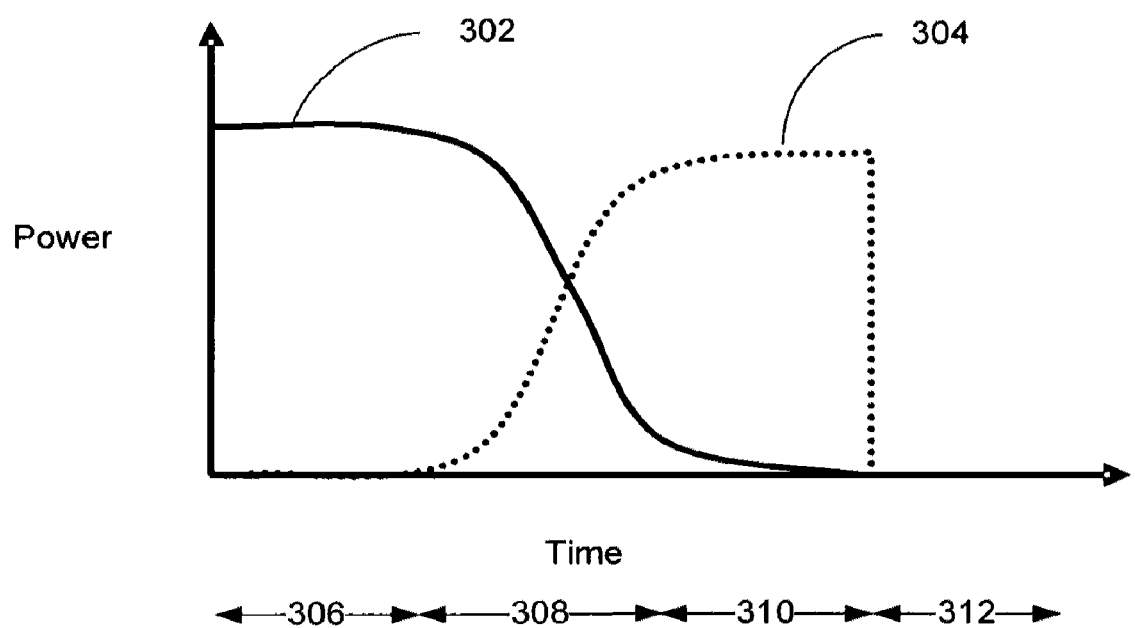
FIG. 3 is a plot of RF power to the first and third electrode for a method in accordance with an embodiment of the present invention.

FIG. 3 is a diagram depicting the relative power applied to the first electrode (302) and to the third electrode (304). Time period 306 corresponds to the deposition stage. Only the first electrode is powered.

In the extraction stage, plasma-induced particles are extracted away from the space above to wafer. In this stage, the main plasma power ramps down as the third electrode power goes up. In FIG. 3, time period 308 corresponds to the extraction stage. FIG. 2B shows the main plasma becoming weaker as the particle extractor electrode 207, also referred to as the third electrode, gains power. While the main plasma becomes weaker, it is still able to suspend particles, because the electric force is so much greater than the other forces pushing the particles down. As the extractor electrode gain power, the plasma expands, and the boundary is moved to include the extractor electrode, as shown in FIG. 2B. The plasma boundary movement and neutral drag allow suspended particles to shift from the location above the carrier ring to outside of a cylindrical space formed by the showerhead and wafer support.

As the main plasma power reduces further, the main plasma collapses, and only plasma remains around the extractor electrode in the trapping stage. In FIG. 3, time period 310 corresponds to the trapping stage. At this time, the main RF power ramps down to zero. FIG. 2C shows the plasma sheath surrounds the extractor electrode rings trapping and suspending particles at a region outside of the showerhead-wafer support cylindrical space.

The last stage is the flushing stage, as shown on FIG. 2D and time period 312 in FIG. 3. Power to the extractor electrode is switched off, extinguishing the plasma 205 in FIG. 2C. Without the electric force suspending them in place, the particles are flushed away by gas flow and vacuum pumping to the pumping ports 209. Pumping ports 209 may be referred to as vacuum forelines. During the flushing stage, inert gas flow to the showerhead may increase so the flush is faster. Additionally, the chamber may be pumped down.

After the chamber is flushed, the wafer may be removed from the wafer support and transferred to the next process. In a multi-station chamber, the next process may be at the next station. In a single station chamber, the next process may be in another chamber attached to the same semiconductor processing tool or to another tool altogether.

FIG. 3 shows the various stages of this implementation with RF power to the first and third (extractor) electrodes. The present invention is not limited to the shape of curves 302 and 304 and the relative values shown. For example, the maximum of curve 304 may be much smaller or even larger than curve 302. The extractor power 304 may ramp down over time instead of a sudden cutoff. One skilled in the art would be able to find an extractor power curve suitable to extract the particles of interest in an amount of time shorter than the purging and waiting process discussed above. Thus, this electric extraction technique has a higher wafer throughput than methods not using an extractor electrode.

Figure 4:
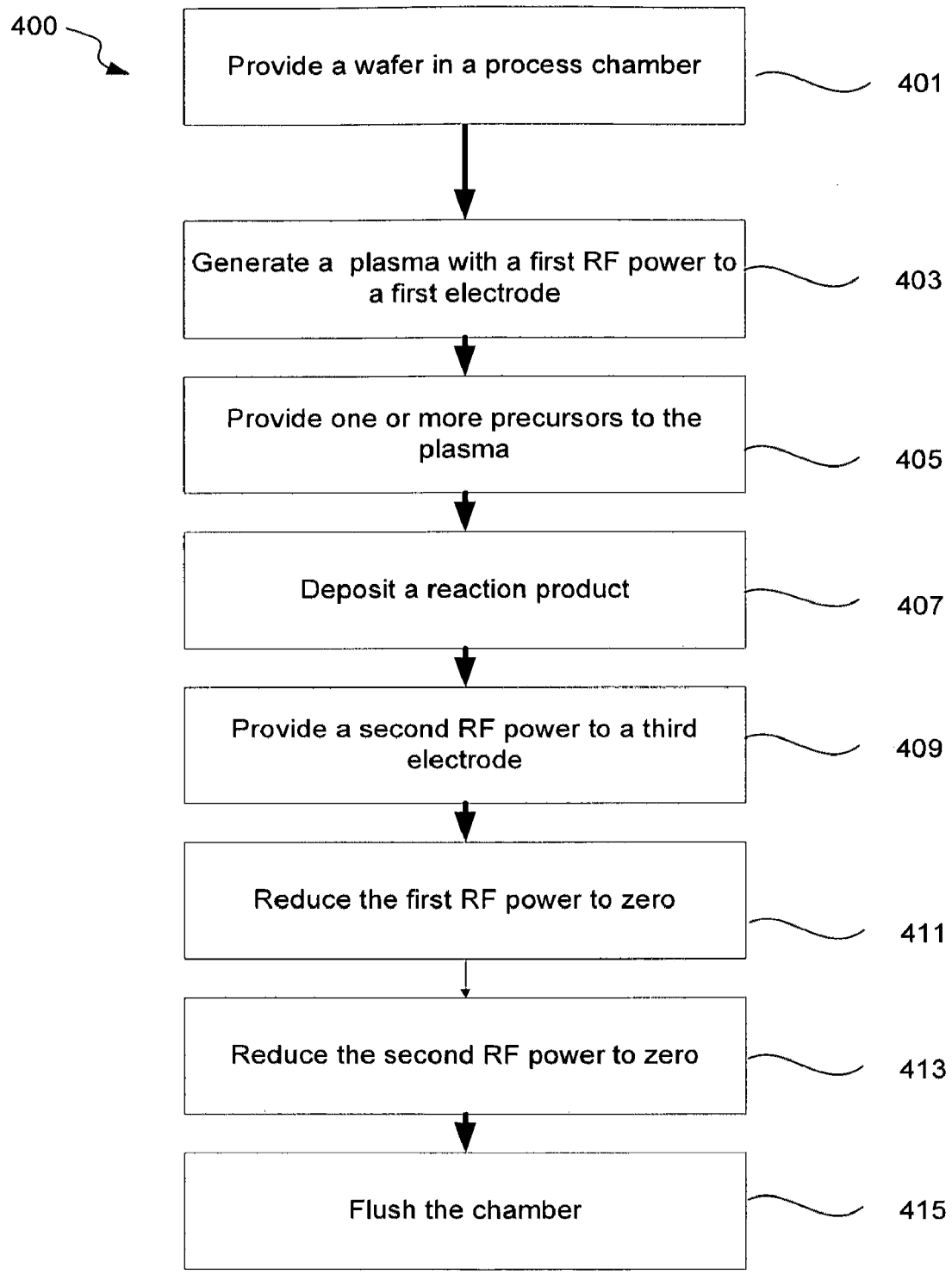
FIG. 4 is a process flow diagram of an example method suitable for implementing the present invention.

FIG. 4 is a process flow chart depicting operations in a method in accordance with an embodiment of this invention. The various stages described above focuses on the locations of the particles and shape of the plasma. The process operations of FIG. 4 focus on the controls and operations to effectuate the particle extraction.

In operation 401, a wafer is provided in a process chamber. The process chamber includes a first and second electrodes above and below a wafer, and a third electrode. In operation 403, a plasma is generated by providing a first RF power to a first electrode. In many chambers, this first electrode is a showerhead and the second electrode includes the wafer support and chamber walls. In other chambers, the first electrode is the wafer support and the second electrode includes the showerhead and chamber walls. This method is applicable to both configurations.

In operation 405, one or more precursors are provided to the plasma. The precursors are the reactive gases that becomes ionized in the plasma and react to form a film on a wafer surface. In operation 407, a reaction product is deposited onto the wafer. This reaction product may be an intermediate product or a final product. An intermediate product may react further with subsequent precursors or with other deposited material to form the film. Other intermediate products require further processing, such as plasma treatment or radiation treatment, before they become the final products.

In operation 409, a second RF power is provided to the third electrode. To minimize a discharge between the first and third electrode, the first and second RF power may be synchronized and in phase. The current disclosure covers also the implementation where the first and second RF powers are not frequency-locked. The first RF power is then reduced to zero, in operation 411. The first RF power may be reduced at the same time as the second RF power ramps up; or, the first RF power may be reduced after the second RF power reaches a certain level. Only after the first RF power is turned off, the second RF power ramps down to zero, in operation 413. The chamber is flushed in operation 415 either concurrently as the second RF power ramps down or after the second RF power reaches zero.

Figure 5:
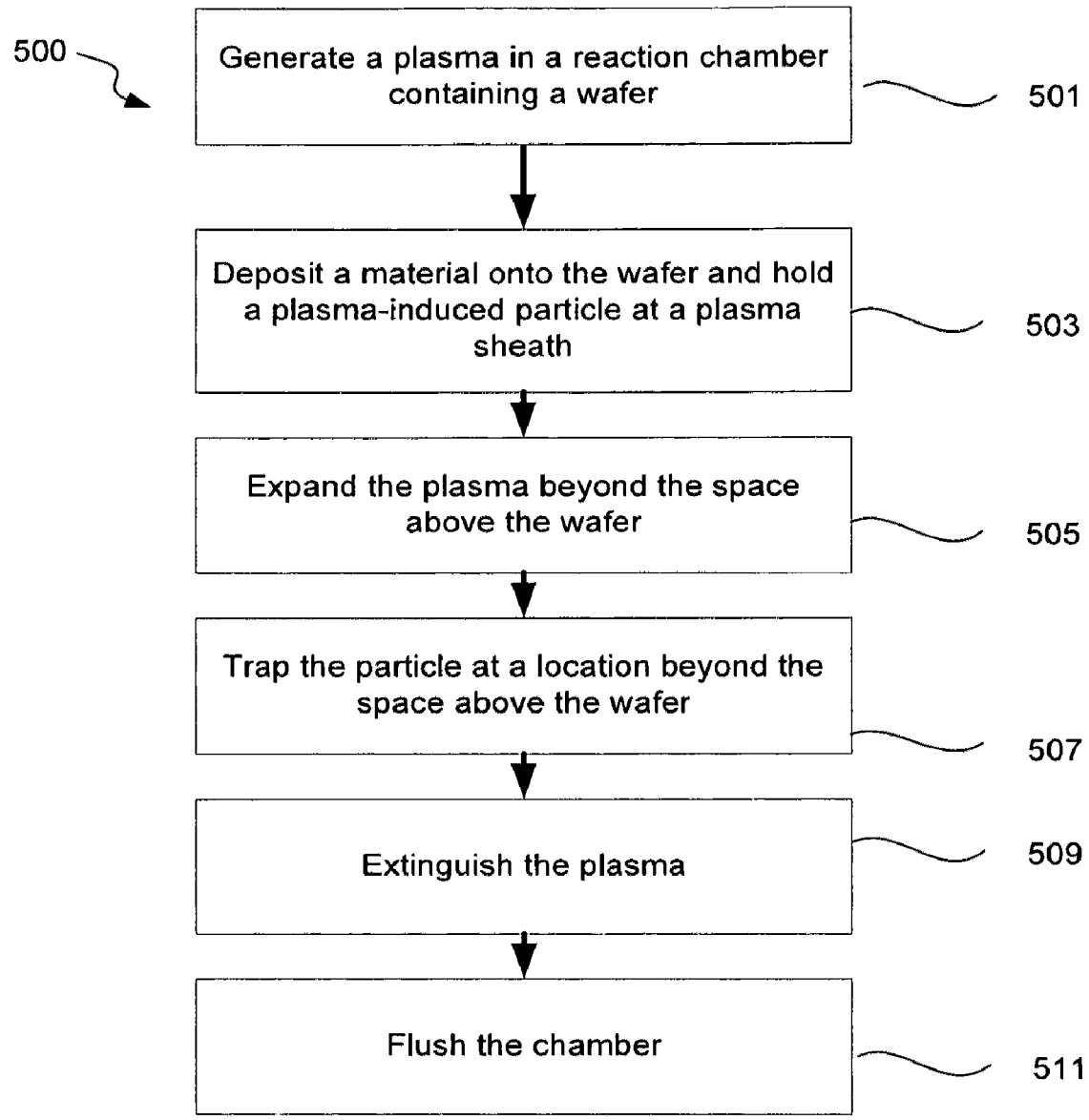
FIG. 5 is a process flow diagram of an example method suitable for implementing the present invention.

FIG. 5 is another process flow chart depicting operations in a method in accordance with an embodiment of this invention. In operation 501, a plasma is generated in a reaction chamber containing a wafer. A material is deposited onto the wafer while a plasma-induced particle is held at a plasma sheath in operation 503. In operation 505, the plasma is expanded beyond the space above the wafer. The plasma expansion allows the plasma-induced particle to move away from the wafer. The plasma may be expanded in many ways. One way, described above, may be to add an additional electrode and power that electrode. Another way may be to change the distance between the electrodes or relative orientation of the electrodes. Based on the interaction of the forces described above, a plasma expansion would allow a suspended particle to move away from the space above the wafer. In operation 507, the plasma-induced particle is trapped at a location beyond the space above the wafer, for example, by using an electric force in a localized plasma. In operation 509, plasma is extinguished. After electric trapping force is gone, the particle is flushed from the chamber in operation 511. Chamber flushing may include purging, evacuating, or both purging and evacuating.

Apparatus

In one aspect, the present invention pertains to a semiconductor processing apparatus. The apparatus may be a processing chamber or a part of a chamber configured to deposit material onto a wafer using a plasma-assisted process. The apparatus includes a wafer support, a showerhead, a first electrode, a second electrode, a third electrode, and a pumping port. The wafer support is attached to a chamber bottom and holds a wafer in place during processing and may optionally provide gas for thermal conduction to the wafer, heat energy to the wafer, or electrostatic force to hold the wafer in place. The wafer support may move vertically or rotate. Typically placed above the wafer support is the showerhead, attached to a chamber top. The showerhead is attached to a top of the chamber through which precursor gases flow into the showerhead. A showerhead face has many small perforations to distribute precursor gases evenly.

The apparatus is designed to deposit dielectric material using plasma-assisted chemical vapor deposition. The deposited material is a reaction product from the plasma decomposed precursor gas. There is no purposeful sputtering of a target to obtain deposition material.

The first electrode is electrically connected to a first RF generator. The first RF generator is capable of generating a plasma by providing power to the first electrode. The second electrode is a return electrode, which may be connected to ground or to another RF generator. Thus a plasma would discharge between the first and second electrode. The first and second electrodes are typically in the shape of disks that are parallel to each other. The cylindrical space in between the electrodes contains the plasma and the wafer.

The third electrode is electrically connected to a second RF source. The second source may be the first generator, in which case a switch is used to connect or disconnect RF power to the third electrode. Alternatively, the second source may use a dedicated RF generator. The third electrode is located outside of the cylindrical space between the first and second electrodes. FIGS. 6A-6E depict different configurations and shapes of the third electrode in accordance with various embodiments of the present invention.

Figure 6A:
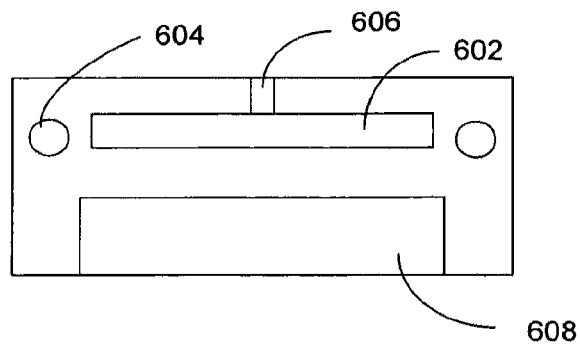
FIGS. 6A-6F are schematics depicting various example hardware embodiments in accordance with the present invention.

FIG. 6A is a side view of a PECVD station in accordance with some embodiments of the present invention. Showerhead 602 is attached via a stem 606 to the top of the chamber. As discussed above, various precursors are injected to the chamber via the stem and the showerhead. The stem may also house electrical connections to the RF generator when the showerhead acts as the first electrode. During deposition, a wafer is placed on the wafer support 608. In certain embodiments, the wafer support 608 may have vertical displacement, e.g., it can move up or down. A number of mechanisms may be used to move the wafer support, e.g., lead-screw and shaft, inductive magnetic bearings, or a linear motor. When it moves up, the space between the first and second electrodes is reduced, and the plasma is intensified. When it moves down, the space between the first and second electrodes is enlarged, and the plasma is expanded.

Figure 6B:
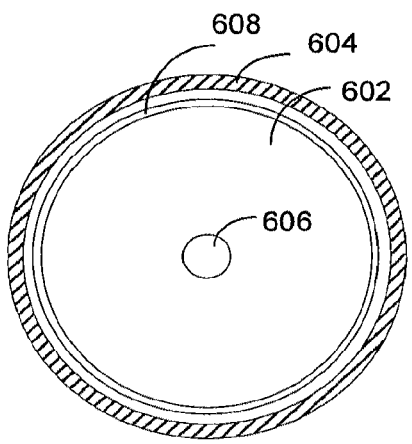

Element 604 is the third electrode, or the particle extractor electrode. FIG. 6B shows the top view of FIG. 6A. The stem 606 is attached to the showerhead 602. In this example, the wafer support 608 shown has a somewhat larger diameter than the showerhead 602 for illustrative purposes. To practice the present invention, there is no requirement as to the relative sizes of the showerhead and the wafer support. The showerhead may be larger or smaller than the wafer support or both may be the same size. The third electrode 604 is shown as a ring with a circular cross section. The third electrode 604 circumferentially surrounds the cylindrical space formed between the showerhead and the wafer support.

Figure 6C:
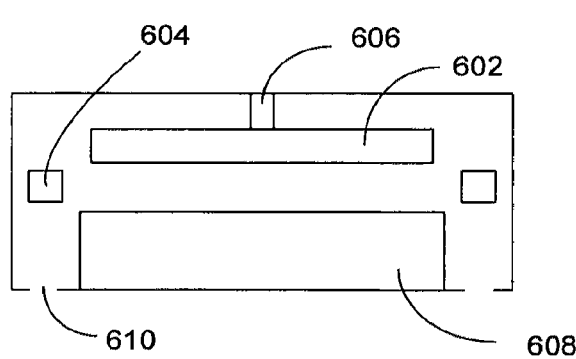
Figure 6D:
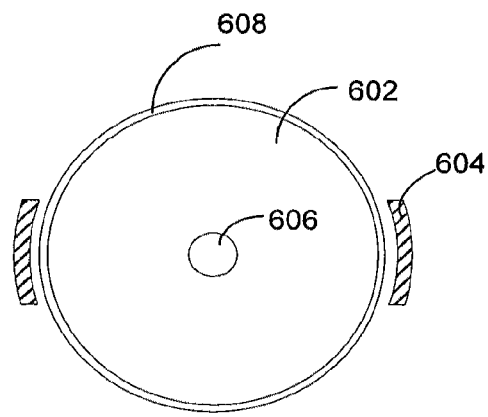
Figure 6E:
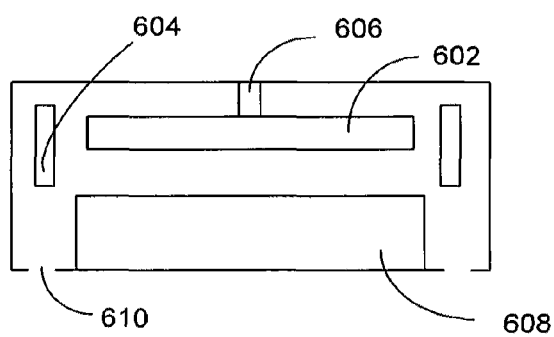
Figure 6F:
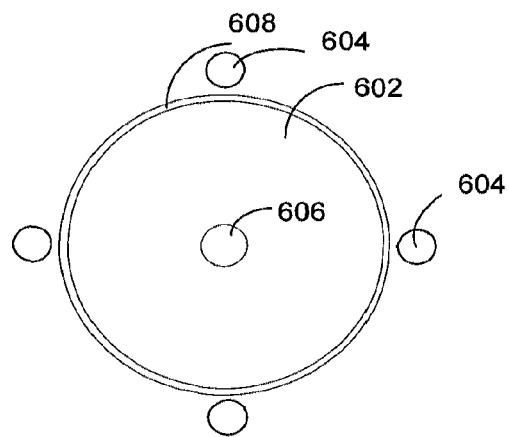

The third electrode may include one or many pieces. In FIGS. 6A and 6B, the third electrode is one piece. In FIGS. 6C and 6D, the third electrode 604 has two pieces. In FIGS. 6E and 6F, the third electrode 604 has 4 pieces. As shown in FIG. 6C, the multiple-piece electrode 604 may be positioned just above pumping ports 610 so that trapped particles may be flushed quickly from the chamber. If a multiple-piece design is used, the pieces are electrically connected to each other and a second RF generator.

The third electrode may be in many shapes. In one example, e.g., FIGS. 6A and 6B, the third electrode is in the shape of a torus or a doughnut. The cross sections shown in FIG. 6A are two circles. The third electrode may also have other cross sections, such as an oval, a half circle, or a rectangle. The third electrode may circumferentially surround the deposition station, but need not be. FIGS. 6C and 6D show a third electrode that only partially surrounds the deposition station. The cross sections shown are two rectangles, but they may be other polygonal shapes. FIGS. 6E and 6F show yet another third electrode shape. In this example there are four rods having a rectangular cross section. FIG. 6F is the top view of FIG. 6E and shows the top cross sections of the rods are circular. However, the rods need not be cylindrical or have the same size at the top and the bottom.

The third electrode may be located closer to the showerhead, the wafer support, or in between. FIG. 6A shows a third electrode located at about the same height at the showerhead. FIG. 6C shows a third electrode located at about midway between the showerhead and electrode. FIG. 6E shows a long electrode. Additionally, the third electrode may have a vertical displacement. The third electrode may move during the extraction and/or the trapping stage to better remove the particles. It is envisioned that the third electrode may move up and away from the wafer during extraction to ensure that all the particles are removed from the space above the wafer. It is also envisioned that once the particles are trapped, the third electrode may move down toward the pumping ports 610 to quickly purge the particles from the chamber.

One skilled in the art can design and test various shape and sizes of third electrodes in one or many pieces located at various positions relative to the showerhead and the wafer support to find a design suitable for particular process parameters and throughput. For example, an electrode position and shape may provide faster extraction or lower power, but not the minimum number of particles. Other variables include the power ramps of the first and second RF generator, gas flows at the end of deposition time, and vacuum pressure. One skilled in the art may use different designs depending on the process parameters and contamination requirements of the process.

While the invention has been described primarily in the context of PECVD, it may also be applicable in other semiconductor processing contexts, such as HDPCVD or other plasma-assisted CVD. Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein.

What is claimed is:

1. A method of plasma-enhanced chemical vapor deposition (PECVD), the method comprising:
   providing a wafer in a process chamber, said chamber comprising first and second electrodes above and below the wafer, and a third electrode disposed outside of a cylindrical space between a showerhead and a wafer support;
   generating a plasma by providing a first RF power to the first electrode;
   providing one or more precursors to the plasma;
   depositing a reaction product of the one or more precursors onto the wafer;
   providing a second RF power to the third electrode and reducing the first RF power to the first electrode, wherein the RF power to the third electrode increases while the RF power to the first electrode decreases;
   reducing the second RF power to the third electrode; and,
   flushing the chamber.

2. The method of claim 1, wherein the third electrode is a ring.

3. The method of claim 1, wherein a particle is flushed from the chamber.

4. The method of claim 1, wherein providing a second RF power to the third electrode and reducing the first RF power to the first electrode occur during a same period of time.

5. The method of claim 1, wherein providing a second RF power to the third electrode comprises a ramping up in RF power over a specific time period.

6. The method of claim 1, wherein the first and second RF powers are synchronized and in phase.

7. The method of claim 1, wherein the first and second electrodes are circular disks.

8. The method of claim 1, wherein the first electrode is a showerhead and the second electrode comprises the wafer support.

9. The method of claim 1, wherein the first electrode is a wafer support and the second electrode comprises the showerhead.

10. The method of claim 1, wherein the RF power to the third electrode is ramped up while the RF power to the first electrode is ramped down.

11. A method of reducing plasma-induced contamination on semiconductor wafers, the method comprising:
- generating a plasma in a reaction chamber;
- depositing a material onto a wafer while holding a plasma-induced particle in a plasma sheath;
- expanding the plasma beyond a space above the wafer;
- trapping the plasma-induced particle at a location beyond the space above the wafer; and,
- flushing the plasma-induced particle from the chamber.

12. The method of claim 11, further comprising extinguishing the plasma.

* * * * *